United States Patent [19]

Yoshikawa et al.

[11] 4,434,224
[45] Feb. 28, 1984

[54] METHOD OF PATTERN FORMATION

[75] Inventors: Akira Yoshikawa, Higashiyamato; Akitsu Takeda, Tokyo; Osamu Ochi, Sayama; Tomoko Hisaki, Tokyo; Yoshihiko Mizushima, Fuchu, all of Japan

[73] Assignee: Nippon Telegraph & Telephone Public Corp., Tokyo, Japan

[21] Appl. No.: 343,908

[22] Filed: Jan. 29, 1982

[30] Foreign Application Priority Data

Feb. 6, 1981 [JP] Japan ................... 56-16613

[51] Int. Cl.³ .............................. G03C 5/00
[52] U.S. Cl. .................... 430/323; 430/312; 430/314; 430/313; 430/324; 430/326; 430/330; 430/329; 430/5; 430/325; 430/322; 156/659.1; 156/661.1
[58] Field of Search ............... 430/314, 312, 313, 323, 430/324, 326, 330, 329, 5, 325; 156/659.1, 661.1

[56] References Cited

U.S. PATENT DOCUMENTS

| | | | |
|---|---|---|---|
| 3,412,456 | 11/1968 | Ebisawa | 430/314 |
| 4,276,368 | 6/1981 | Heller et al. | 430/322 |
| 4,320,191 | 3/1982 | Yoshikawa et al. | 430/323 |
| 4,339,526 | 7/1982 | Baise et al. | 430/330 |

OTHER PUBLICATIONS

"Bilevel High Resolution Photolithographic Technique . . ." by Tai et al., J. Vac. Sci. Technol., 16(6), Nov./Dec. 1979.

"Submicron Optical Lithography Using an Inorganic Resist/Polymer Bilevel Scheme" by Tai et al., J. Vac. Sci. Technol., 17(5), Sep./Oct. 1980.

Primary Examiner—Won H. Louie, Jr.
Attorney, Agent, or Firm—Kenyon & Kenyon

[57] ABSTRACT

In a method of pattern formation according to this invention, an organic polymer resist material is simultaneously used with an inorganic resist material, i.e., a first desired pattern consisting of the organic polymer resist material layer is formed on a substrate material, then the whole surface thereof is covered with the inorganic resist material layer, a second desired pattern is then formed with the inorganic resist material layer, and then the resulting second desired pattern is transferred to the organic polymer resist material. According to the invention, mask alignment can automatically be effected by detecting reflected light from an alignment mark on the substrate, formation of a relief including large and small patterns is also easily carried out, throughput can also be increased. The method of the invention may be combined with various process steps, so that such combined method is applicable for deep and shallow etching, formation of an interlayer insulation film, and lift-off method.

18 Claims, 35 Drawing Figures

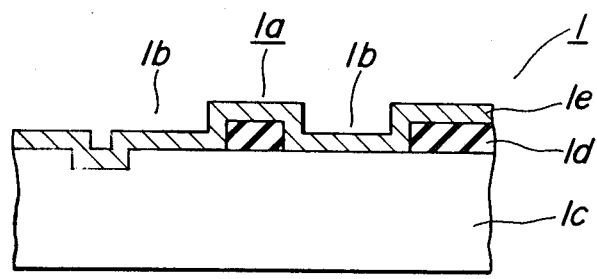
FIG_1a
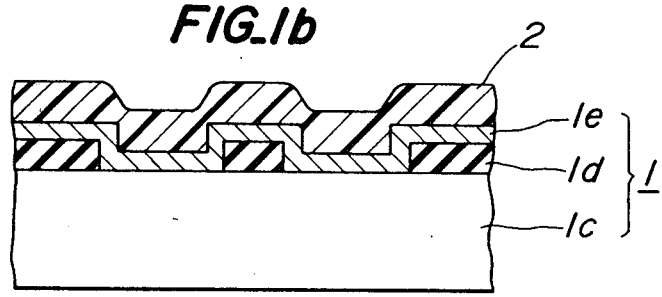
FIG_1b
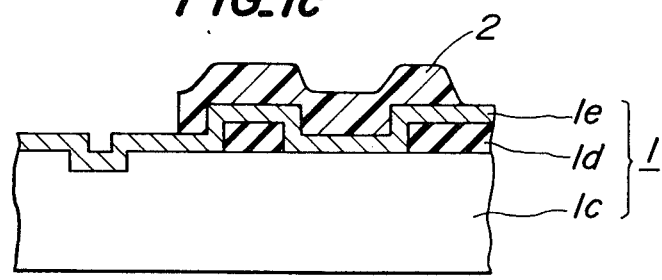
FIG_1c

METHOD OF PATTERN FORMATION

BACKGROUND OF THE INVENTION

The present invention relates to a method of pattern formation which is utilized in the manufacture of semiconductor devices and the like.

Heretofore, the formation of a pattern in the manufacture of semiconductor devices, integrated circuits and the like has been mainly carried out in accordance with a photolithographic technique wherein a photoresist made of a photosensitive organic polymer resist material is utilized. However, as a result of advancements in recent semiconductor devices and the like, particularly in the field of large scale integrated circuits, the tolerances required for pattern formation have become very small as a result of reduction in the size of elements in a device and an increase of the packing density of elements. Other factors which require reduced manufacturing tolerances include the growing of nonplanar features of surfaces of elements, a diversification in the types of materials to be etched, the increased complexity of multilevel interconnection, and an increase in the ion-stopping ability which is required of a mask during ion implantation with an increased ion implantation energy. Thus, a photoetching technique in which a conventional organic polymer resist material is utilized is not capable of complying with the tolerance and other requirements mentioned above.

On the other hand, an inorganic resist material made as a laminate consisting of a selenium-based glass material layer and a silver layer or a layer containing a silver compound or silver in an alloy or the like has recently been developed (see U.S. Pat. No. 4,127,414). This inorganic resist material is of considerable interest because of its many excellent characteristics, including high resolution, which are superior to those of a conventional organic polymer resist material. However, even if photoetching is effected by the use of such an inorganic resist material as described above, it is required that the inorganic resist material layer be extremely this in order to obtain the high resolution characteristic. Accordingly, there still remains a problem in the application of such an inorganic resist material to a nonplanar substrate surface or metal layer. Furthermore, since optimum conditions such as exposure, development and the like differ in the case where a relatively large pattern is formed from the case where a fine pattern is formed, there is a problem in that the quality of the patterns deteriorates as a whole in the formation of a device having a relief which includes large and small patterns.

In this respect, U.S. Ser. No. 35,803 (or corresponding Japanese Laid-open Patent Application No. 149,941/1980 or European Patent Application Publication No. 0,018,653) "Process for fabrication of an article" as well as relevant papers "Bilevel high resolution photolithographic technique for use with wafers with stepped and/or reflecting surfaces" (J. Vac. Sci, Technol., 16(6), Nov./Dec. 1979, pp 1977–1979) and "Submicron optical lithography using an inorganic resist/polymer bilevel scheme" (J. Vac. Sci. Technol., 17(5), Sept./Oct. 1980, pp 1169–1176) disclose a bilevel resist prepared by laminating the above-mentioned inorganic resist onto an organic polymer layer as a kind of multilayer resist. Such a bilevel resist has the following advantages:

First, the flattening of a nonplanar substrate surface by means of the organic polymer resist material layer, and the formation of a fine pattern on a stepped or highly reflecting substrate by means of the inorganic resist are easily achieved to the high optic absorption of the resist. Furthermore, the formation of a thick polymer resist pattern having a rectangular section is also easy to achieve, and therefore, the aforesaid bilevel resist has a strong resistance which is required for the etching mask when performing reactive ion etching or ion beam etching working. The aforesaid process for the formation of the bilevel resist is also effective for forming a mask pattern for ion implantation.

However, there still remains a substantial drawback with the inorganic resist in bilevel resist during the formation of the pattern. Namely, the exposing and developing characteristics of the inorganic resist are different in the formation of a fine pattern from the formation of a comparatively large pattern. These characteristics can be adjusted such that when fine and larger patterns are separately formed, it is possible to make patterns of equivalent quality. In general, however, particularly in LSI, there are many cases in which these large and small patterns are both included. In forming a relief which includes such large and small patterns, the pattern formation of the above-mentioned bilevel resist is carried out under the same exposing and developing conditions of the inorganic resist in both types of patterns, resulting in either or both of the patterns being of unsatisfactory quality. As described above, a relief which includes large and small patterns cannot satisfactorily be formed by merely utilizing such bilevel resist.

In addition, difficulty in the alignment of a mask is an inherent problem with such a bilevel resist. In a projection exposure system, the automatic alignment of the mask is carried out by detecting light which is reflected by an alignment mark on the substrate. However, as described above, the most advantageous points of the bilevel resist in the flattening of a substrate surface and removal of the reflected light from the substrate. Therefore, no reflected light is obtained from the alignment mark covered with the bilevel resist, so that the above-stated automatic alignment of the mask is impossible. Furthermore, in such bilevel resist, the polymer layer and inorganic resist layer are always treated as an integral member, but neither of them is individually patterned. In other words, there has been no consideration of such bilevel resist in the prior art concerning its application to various pattern formations.

It is therefore an object of the invention to eliminate the above-mentioned disadvantages and to provide a method of pattern formation which is widely applicable, has various pattern forming functions, and by which a pattern with high resolution can be formed.

It is another object of the invention to provide a method of pattern formation by which a multilevel interconnection pattern can be formed by utilizing the organic polymer resist material layer in a two-layer resist as an interlayer insulation film or layer.

It is still another object of the invention to provide a method of pattern formation by which a thin film pattern according to a lift-off process can suitably be formed by utilizing a two-layer resist.

SUMMARY OF THE INVENTION

In order to achieve these objects as described above, the method of the present invention comprises the steps of forming a first desired pattern consisting of an organic polymer resist material layer on the main surface of a material to be worked, applying a heat treatment to the patterned orgainic polymer resist material layer, forming an inorganic resist material layer being a laminate consisting of a selenium-based glass material and a silver layer or layer containing silver on the organic polymer resist material layer thus heat-treated so as to cover the whole surface thereof, forming a second desired pattern with the aforesaid inorganic resist material layer, etching to remove the organic polymer resist material layer in a region which is not covered with the patterned inorganic resist material layer, applying an etching treatment to the aforesaid material to be worked in a region which is not covered with the aforesaid organic polymer resist material layer, and removing the aforesaid inorganic and high polymeric organic resist material layers.

In accordance with a second aspect of the present invention, the method thereof comprises the steps of forming a first desired pattern consisting of an organic polymer resist material layer on the main surface of a material to be worked, applying a heat treatment to the patterned organic polymer resist material layer, forming an inorganic resist material layer being a laminate consisting of a seleniumbased glass material layer and a silver layer or layer containing silver on the organic polymer resist material layer thus heat-treated so as to cover the whole surface thereof, forming a second desired pattern with the aforesaid inorganic resist material layer, etching to remove the polymer resist material layer in a region which is not covered with the patterned inorganic resist material layer, removing the aforesaid inorganic resist material layer, applying an etching treatment to the aforesaid material to be worked in a region which is not covered with the aforesaid organic resist material layer, and removing the aforesaid organic polymer resist material layer.

In accordance with a third aspect of the present invention, the method thereof comprises the steps of forming a first desired pattern consisting of an organic polymer resist material layer on the main surface of a material to be worked, applying a heat treatment to the patterned organic polymer resist material layer, etching to remove the aforesaid material to be worked in a region which is not covered with the aforesaid patterned organic polymer resist material layer, forming an inorganic resist material layer being a laminate consisting of a selenium-based glass material layer and a silver layer or layer containing silver on the organic polymer resist material layer thus heat-treated and the exposed surface of the aforesaid material to be worked by means of the aforesaid etching treatment so as to cover the whole surface of the aforesaid organic polymer resist material layer and the surface of the aforesaid exposed material to be worked, forming a second desired pattern with the aforesaid inorganic resist material layer, etching to remove the organic polymer resist material layer in a region which is not covered with the patterned inorganic resist material layer, applying an etching treatment to the aforesaid material to be worked in a region which is not covered with the aforesaid organic polymer resist material layer, and removing the aforesaid inorganic and organic polymer resist material layers, In accordance with a fourth aspect of the present invention, the method thereof comprises the steps of forming a first desired pattern consisting of an organic polymer resist material layer on the main surface of a substrate material provided with a patterned conductor layer, applying a heat treatment to the aforesaid patterned organic polymer resist material layer, forming an inorganic resist material layer being a laminate consisting of a selenium-based glass material layer and a silver layer or layer containing silver on the organic polymer resist material layer thus heat-treated so as to cover the whole surface thereof, forming a second desired pattern with the aforesaid inorganic resist material layer, etching to remove the organic polymer resist material layer in a region which is not covered with the patterned inorganic resist material layer, removing the aforesaid inorganic material layer, and forming a third desired pattern consisting of a conductive layer on the aforesaid organic polymer resist material layer and the main surface of the aforesaid substrate material in a region which is not covered with the aforesaid organic polymer resist material layer.

In accordance with a fifth aspect of the present invention, the method thereof comprises the steps of forming a first desired pattern consisting of an organic polymer resist material layer on the main surface of a substrate material, applying a heat treatment to the patterned organic polymer resist material layer, forming an inorganic resist material layer being a laminate consisting of a selenium-based glass material layer and a silver layer or layer containing silver on the organic polymer resist material layer thus heat-treated so as to cover the whole surface thereof, forming a second desired pattern with the aforesaid inorganic resist material layer, etching to remove the organic polymer resist material layer in a region which is not covered with the patterned inorganic resist material layer, forming a thin film layer on the aforesaid inorganic resist material layer and the main surface of the aforesaid substrate material in a region which is not covered with the aforesaid organic polymer resist material layer, and removing the aforesaid inorganic and organic polymer resist material layers together with the aforesaid this film layer formed on the aforesaid inorganic resist material layer.

In accordane with a sixth aspect of the present invention, the method thereof comprises the steps of forming a first desired pattern consisting of an organic polymer resist material layer on the main surface of a substrate material, applying a heat treatment to the patterned organic polymer resist material layer, forming an inorganic resist material layer being a laminate consisting of a selenium-based glass material layer and a silver layer or layer containing silver on the polymer resist material layer thus heat-treated so as to cover the whole surface thereof, forming a second desired pattern with the aforesaid inorganic resist material layer, etching to remove the organic polymer resist material layer in a region which is not covered with the patterned inorganic resist material layer, removing the aforesaid inorganic resist material layer, forming a thin film layer on the aforesaid organic polymer resist material layer and the main surface of said substrate material in a region which is not covered with the aforesaid organic polymer resist material layer, and removing the aforesaid organic polymere resist material layer together with the aforesaid thin film layer formed thereon.

Furthermore, in the present invention, it is preferred that the aforesaid organic polymer resist material layer be made from a resist material comprising cyclized polybutadiene rubber as the principal constituent, while the aforesaid selenium-based glass material layer is made from a glass material comprising selenium and germanium as the principal constituents.

DETAILED DESCRIPTION OF THE PREFERRED EMBODIMENTS

The method of pattern formation according to the present invention will be described in more detail hereinbelow with reference to the preferred embodiments thereof.

Figure 1D:
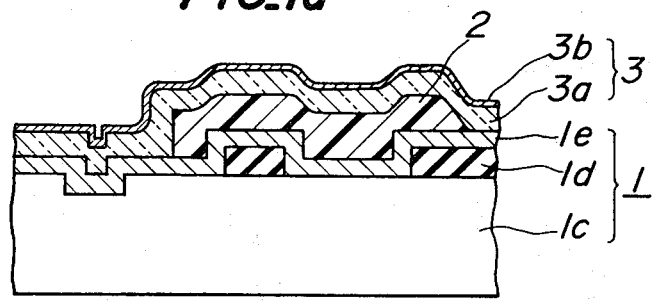
FIGS. 1a–1a are sectional views for explaining each stage in an embodiment of the method of pattern formation according to the present invention.

FIGS. 1a–1i are sectional views each showing a pattern in each stage of an embodiment of the method of pattern formation in accordance with the invention in which a window is established onto a recess 1b formed on the main surface 1a of a substrate material 1 as a material to be worked. Photoetching technique is very frequently applied to such nonplanar surface in a manufacturing process of integrated circuits or the like. The substrate material 1 has, as shown in FIG. 1a, such structure obtained by disposing a first layer 1d made of a silicon oxide film formed to establish a prescribed pattern on the main surface of a semiconductor wafer 1c made of silicon by means of photoetching, and further placing a second layer 1e made of $SiO_2$, aluminum or the like on the main surface of the semiconductor wafer 1c so as to cover the whole surface thereof including the first layer 1d.

In case of providing a window on the recess 1b of the substrate material 1 having the structure as described above, first an organic polymer resist material layer 2 is formed on the main surface of the substrate material 1 so as to cover the whole surface thereof as shown in FIG. 1b. As such an organic polymer resist material, any material having a sufficient adhesion to the second layer 1e of the substrate material 1 irrespective of negative or positive type may be employed. For instance, all the resists possessing such trade names as CBR, KPR, OSR, OMR, KMER, KTFR, Waycoat, AZ and so on are preferable. Among others more preferable is a resist containing cyclized polybutadiene rubber as the principal constituent, for example, a negative photoresist CBR-M901 manufactured by Japan Synthetic Rubber Co., Ltd., because such type of photoresist has excellent heat-resisting properties. A film thickness of such resist may be within such an extent in which the resist does not produce pinhole, but can cover completely the nonplanar surface of the substrate material 1, i.e., it is preferable that such thickness is within a range of from around 1000 Å or more to several μm or less.

Pre-baking is applied to the organic polymer resist material 2 thus formed in accordance with a publicly known process, thereafter the organic polymer resist material layer 2 is exposed so as to leave at least a portion covering a nonplanar part of the substrate material 1, and the so exposed organic polymer resist material layer is succeedingly developed in accordance with a publicly known manner to form a first desired pattern with the organic polymer resist material layer 2 on the main surface 1a of the substrate material 1 as shown in FIG. 1c. Then, the patterned organic polymer resist material layer 2 is subjected to heat treatment to cure the same. In this case, a required temperature is deteremined depending upon type of the resist material to be employed. For instance, a temperature within a range of about 200°–250° C. is preferable in case of utilizing CBR-M901. In the process of this heat treatment, the organic polymer resist material 2 presents softening and fluidizing phenomenon termed generally þresist flow." Accordingly, nonplanar surface in the main surface of the substrate material 1 is remarkably moderated on the surface of the organic polymer resist material layer 2, so that it is very advantageous for the succeeding formation of an inorganic resist material layer and photoetching.

Figure 1E:
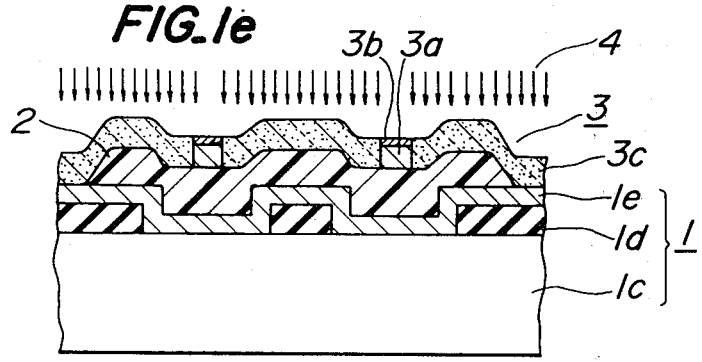
Figure 1F:
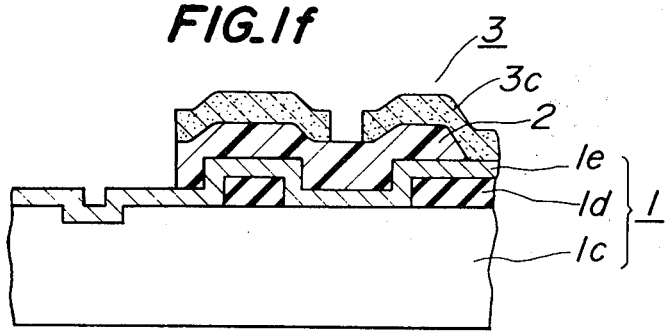
Figure 1G:
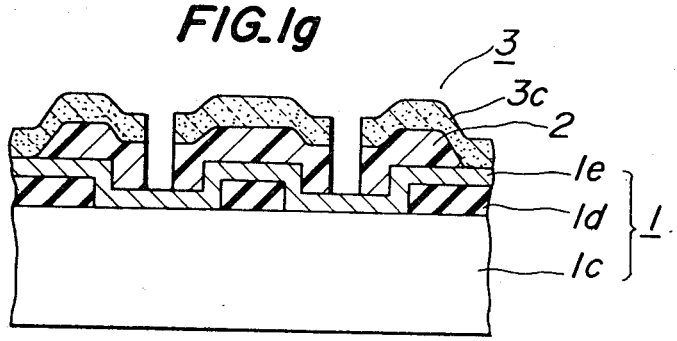

Then, as shown in FIG. 1d, a selenium-based glass material layer 3a and a silver layer or layer 3b containing silver are successively laminated so as to cover the whole main surface of the substrate material 1 involving the organic polymer resist material layer 2 with which the first desired pattern is formed and the pattern is then subjected to thermosetting treatment in accordance with respective known processes to form an inorganic resist material layer 3 (see U.S. Pat. No. 4,127,414). Thereafter, as shown in FIG. 1e, when the inorganic resist material layer is subjected to exposure with a second desired pattern by means of light or accelerated particle beam 4 such as electron beam or the like, the exposed portion of the selenium-based glass material layer 3a is doped with silver to form a silver doped region 3c. Further, as shown in FIG. 1f, development is effected upon the substrate material by etching to remove the silver layer or layer 3b containing silver remained on unexposed portions of the inorganic resist material layer 3 and the selenium-based glass material layer 3a which is not doped with silver in accordance with a known manner and as a consequence, the second desired pattern can be formed by means of the inorganic resist material layer 3. As the selenium-based glass material constituting such inorganic resist material layer 3 as described above, any material presenting such doping phenomenon of silver upon exposure by means of the aforesaid light or accelerated particle beam 4 may be utilized, but a binary system glass material consisting of Se and Ge, particularly a material having such composition consisting of about 80 atom % of Se and about 20 atom % of Ge is preferable in view of resolution and sensitivity of the inorganic resist material layer 3. Moreover, a film thickness of such selenium-based glass material layer 3a may be within an extent in which the layer can be formed without generating any pinhole thereon, and a preferable thickness is within the range from about several hundreds Å or more to 1 μm or less. Thereafter, as shown in FIG. 1g, etching is carried out by utilizing the inorganic resist material layer 3 on which the second desired pattern has been formed, i.e., the silver doped region 3c as a mask, thereby removing portions of the organic polymer resist material layer 2 which are not covered with the aforesaid mask. Such etching can be effected by a wet process in which a suitable solvent which can dissolve off the aforesaid organic polymer resist material is used, but dry etching by means of oxygen gas plasma, particularly an etching process having directional property as in reactive ion etching wherein a parallel flat plate-shaped plasma etching device is employed is preferable. In the case of the latter process, the etching proceeds only along the direction of depth of the substrate material 1 and accordingly, there arises no undercut, so that a high resolution characteristic of the inorganic resist material layer 3 is not adversely affected. The selenium-based glass layer material has a very strong resistance with respect to such dry etching treatment by means of oxygen gas plasma, and therefore such selenium-based glass layer is very suitable for an etching mask.

Figure 1H:
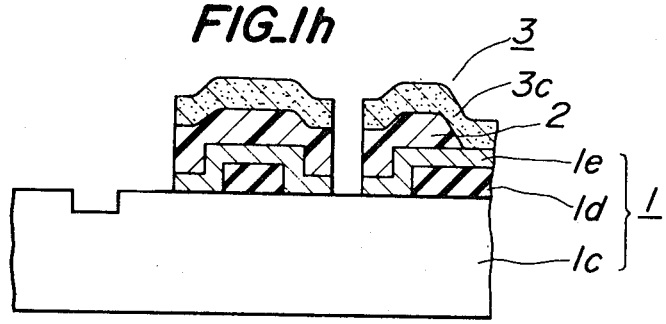

As shown in FIG. 1h, the second layer 1e in the substrate material 1 is then etched by utilizing the inorganic resist material layer 3 formed to establish the second desired pattern and the organic polymer resist material layer 2 onto which the aforesaid pattern has been transferred as etching masks. The etching may be carried out by either a wet etching process by the use of a known etchant dependent on the material of the second layer 1e, for example, if the second layer 1e is made of $SiO_2$ or Al, an etchant buffer hydrofluoric acid or hot concentrated phosphoric acid is employed, or a dry etching process in which a publicly known gas suitable for the material of second layer 1e is utilized. As a result, it is also possible that the etching treatment for the organic polymer resist material layer 2 shown in FIG. 1g is carried out by a dry etching process in which oxygen gas is utilized, and another etching is succeedingly effected for the second layer 1e by merely replacing the oxygen gas by another etching gas in the same device.

Furthermore, developing treatment for the inorganic resist material layer 3 as shown in FIG. 1f may be effected by plasma etching in which a variety of freon gases is utilized, so that it is also possible to effect all the treatments for the inorganic resist material layer 3, the organic polymer resist material layer 2 and the second layer 1e shown in FIGS. 1f, 1g and 1h, respectively, in the same etching device, whereby the process steps can be simplified.

Figure 1I:
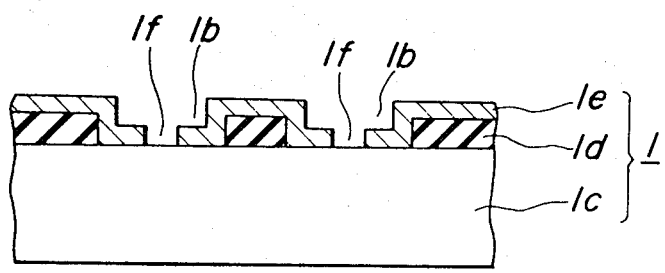

Then, when the inorganic resist material layer 3 and the organic polymer resist material layer 2 are removed as shown in FIG. 1i, the substrate material 1 in the recess 1b in which a window 1f is formed can be obtained. Any known removal treatment can be used as long as the second layer 1e is not damaged. For instance, a method is one in which such treatment is carried out by the use of mixed solution consisting of sulfuric acid and hydrogen peroxide, or hot concentrated sulfuric acid. Another suitable method is one in which the inorganic resist material layer 3 is first removed by dipping the substrate material in weak alkaline solution for a long period of time, and then the organic polymer resist material layer 2 is removed by means of oxygen plasma. Any other similar method for removal may be utilized.

In the above-mentioned embodiment, although a window is produced in the recessed portions of the surface of the substrate material, the method of pattern formation according to the present invention is also applicable to a nonplanar substrate surface. Accordingly, the invention is, of course, applicable in the production of a variety of pattern formations, e.g., provision of a window upon convexed portions, provision of a window on a substrate involving the stepped surface, and the like pattern formation to achieve the same advantageous effects as stated above.

Figure 2A:
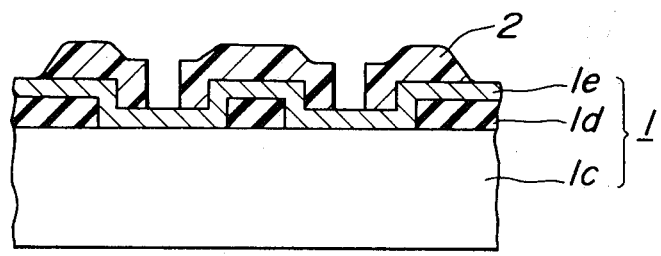
FIGS. 2a–2c are sectional views for explaining each stage in another embodiment of the method according to the invention.
Figure 2B:
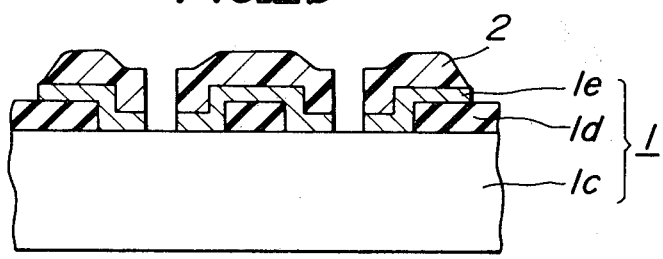
Figure 2C:
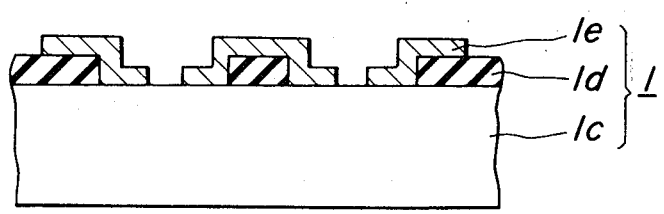

FIGS. 2a–2c are sectional views each showing a pattern in each stage of another embodiment of the method of pattern formation according to the present invention. In this embodiment, similar process steps for the treatment to that shown in FIGS. 1a–1g are made before the process steps as shown in FIGS. 2a–2c are carried out. Namely, as mentioned above, the first desired pattern is formed with the organic polymer resist material layer 2 on the substrate material 1, and then the second desired pattern is formed with the inorganic resist material layer 3 thereon to transfer the pattern to the aforesaid organic polymer resist material layer 2. Thereafter, the inorganic resist material layer 3 is removed as shown in FIG. 2a, and a layer to be worked on the substrate material 1, i.e., the second layer 1e made of, for example, Al is then etched by utilizing the orgaic polymer resist material layer 2 as the mask as shown in FIG. 2b. Finally, when the remained organic polymer resist material layer 2 is removed, a desired relief including large and small patterns can be formed as shown in FIG. 2c.

As is understood from the above description, the present embodiment relates to a method in which the organic polymer resist material layer 2, which is utilized for covering and flattening a nonplanar substrate surface in the first embodiment shown in FIGS. 1a–1i, is more positively used as an efficient mask for forming a relatively large pattern on the substrate material 1. By functionally dividing the method of pattern formation, in other words, if a fine pattern and larger pattern are formed on a substrate material by means of an inorganic resist and an organic polymer resist, respectively, it becomes advantageous to form such a relief involving a fine pattern within a region from several microns to submicrons and a larger pattern which does not require such high accuracy on a substrate surface. Such example is frequently found in the simultaneous formation of fine metalization pattern with bonding pad pattern of integrated circuits and the like cases, so that the method of the second embodiment is very effective for these cases.

Figure 3A:
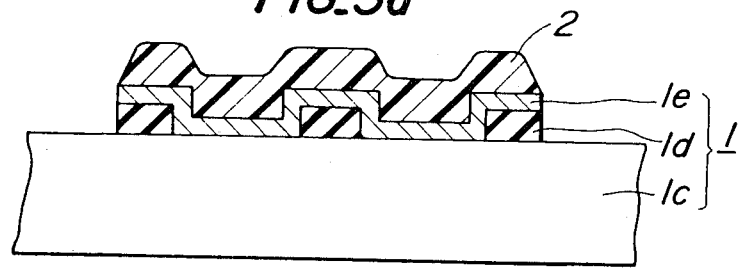
FIGS. 3a–3g are sectional views for explaining each stage in a further embodiment of the method according to the invention.

In the second embodiment, although such manner that the fine pattern formed with the inorganic resist material layer 3 is transferred to the organic polymer resist material layer 2, and then etching is applied to the layer to be worked in accordance with the larger pattern by utilizing the aforesaid organic polymer resist material layer 2 is specified, such manner may be somewhat modified. For instance, a larger pattern is formed with the organic polymer resist material layer 2 as shown in FIG. 1c, and then the second layer 1e and the first layer 1d being the layers to be worked are subjected to an etching treatment to remove the layers 1e and 1d which are not covered with the patterned organic polymer resist material layer 2 as shown in FIG. 3a.

Figure 3B:
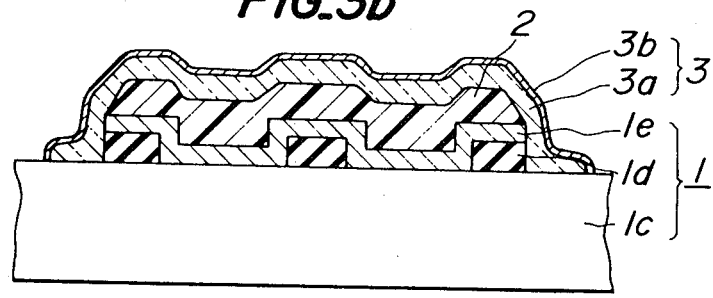
Figure 3C:
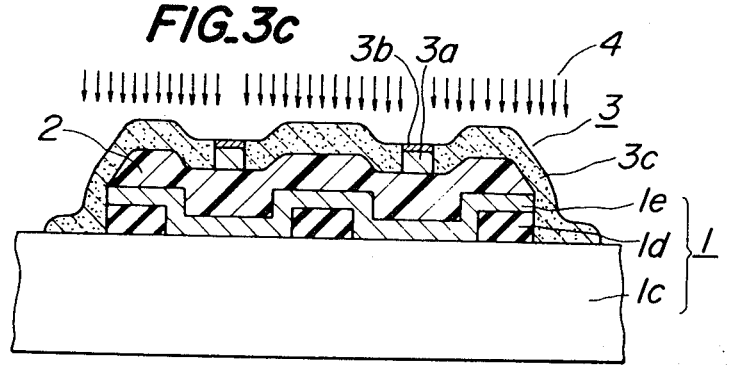
Figure 3D:
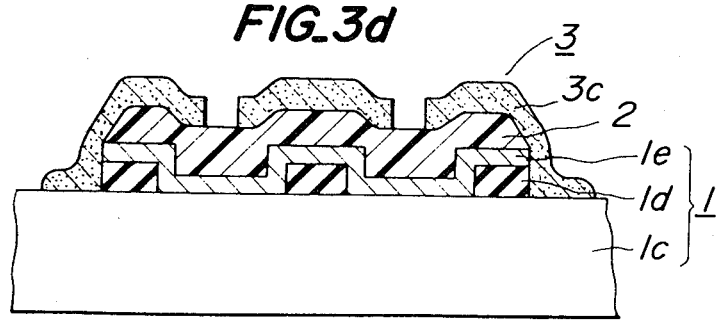

Thereafter, as shown in FIG. 3b, the inorganic resist material layer 3 consisting of the selenium-based glass material layer 3a and the silver layer or layer 3b containing silver is formed on the whole main surface of the patterned organic polymer resist material layer to which a thermosetting treatment is applied as well as the surface of the material to be worked which is exposed by the etching treatment, i.e., the main surface of the substrate material 1 (semiconductor wafer 1c in FIG. 3b) so as to cover both surfaces. Then, when exposure is carried out with a desired fine pattern by means of light or accelerated particle beam 4 such as light electron beam or the like, the selenium-based glass material layer 3a in the exposed portion is doped with silver to form the silver doped region 3c as shown in FIG. 3c. Furthermore, development is made on the substrate material by etching to remove the silver layer or layer 3b containing silver remained on unexposed portions of the inorganic resist material layer 3 and the selenium-based glass material layer 3a which is not doped with silver in accordance with a publicly known manner, whereby a fine pattern is formed with the inorganic resist material layer 3 as shown in FIG. 3d.

Figure 3E:
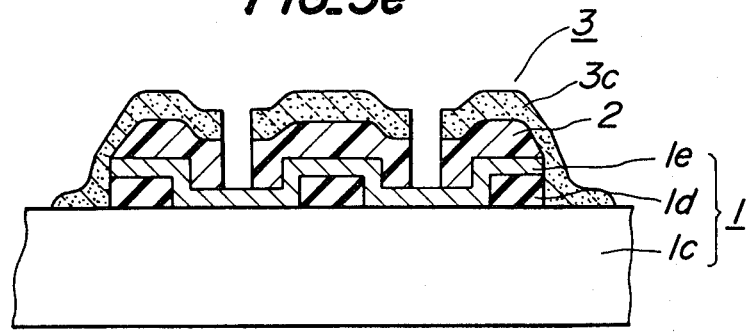
Figure 3F:
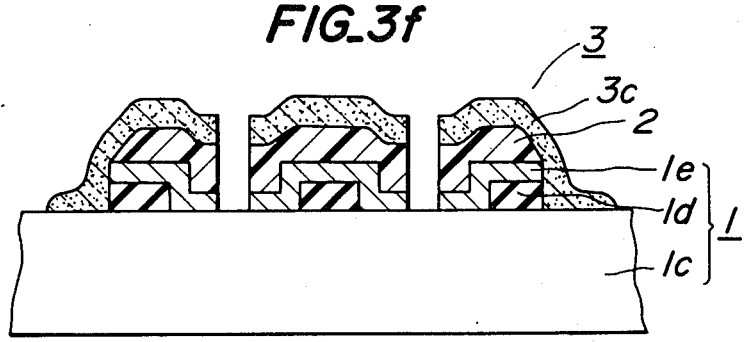
Figure 3G:
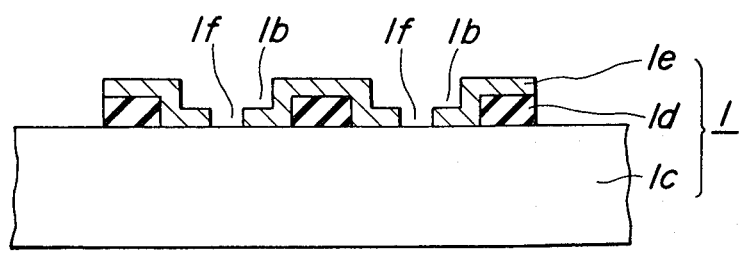

Then, etching is carried out by utilizing the finely patterned inorganic resist material layer 3, i.e., the silver doped region 3c as a mask to remove a portion of the organic polymer resist material layer 2 which is not covered with the mask, whereby the fine pattern is transferred to the organic polymer resist material layer 2 as shown in FIG. 3e. Thereafter the second layer 1e on the substrate material 1 is etched by utilizing the finely patterned inorganic resist material layer 3 and the organic polymer resist material layer 2 to which the above described fine pattern has been transferred as a mask as shown in FIG. 3f. Finally, the inorganic resist material layer 3 and the organic polymer resist material layer 2 are removed to obtain the patterned substrate material 1 in which the window 1f is formed on the recess 1b as shown in FIG. 3g.

In both of the embodiments mentioned above, the organic polymer resist material layer having the first desired pattern as well as the inorganic resist material layer possessing the second desired pattern have been utilized as an etching mask for patterning the substrate material being a material to be worked, and finally both resist material layers have been removed. However it is possible that the organic polymer resist material layer formed on the substrate material is left as it stands without removing the resist material layer, and such layer is utilized as an element of the resulting semiconductor devices. As a typical example, such manner is applicable for a formation of an interlayer insulation layer used for multilevel interconnection in integrated circuits and the like.

Figure 4A:
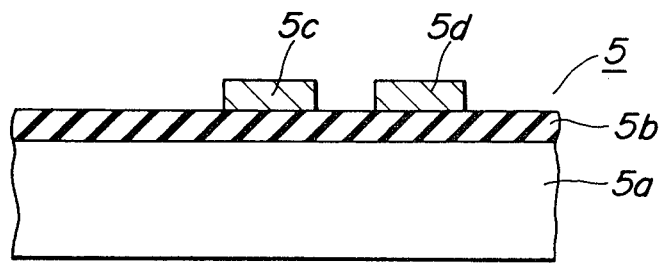
FIGS. 4a–4j are sectional views for explaining each stage in still another embodiment of the method according to the invention.

FIGS. 4a–4j are sectional views each showing each stage of an embodiment in the case as mentioned above. As shown in FIG. 4a, a substrate material 5 has such a construction that an insulation layer 5b made of SiO₂ is formed on the main surface of a semiconductor wafer made of silicon, and conductor layers 5c and 5d consisting of, for example, Al, polycrystal silicon, molybdenum or the like are disposed thereon.

Figure 4B:
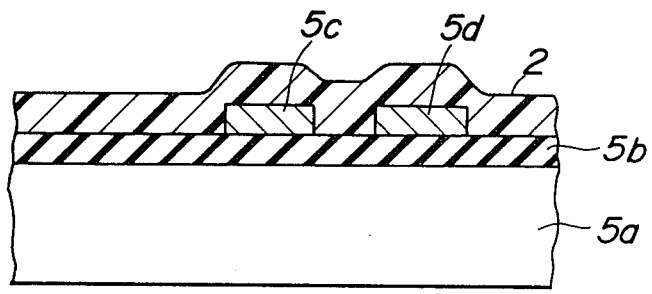
Figure 4C:
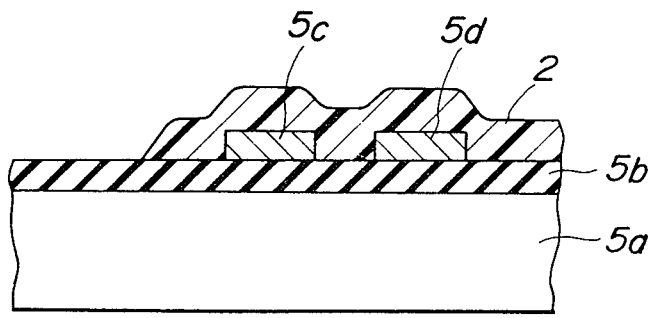
Figure 4D:
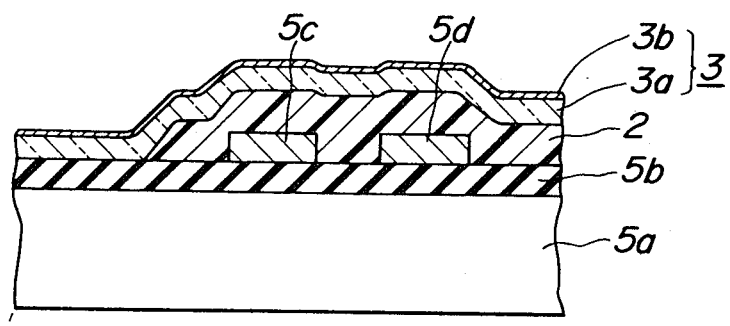
Figure 4E:
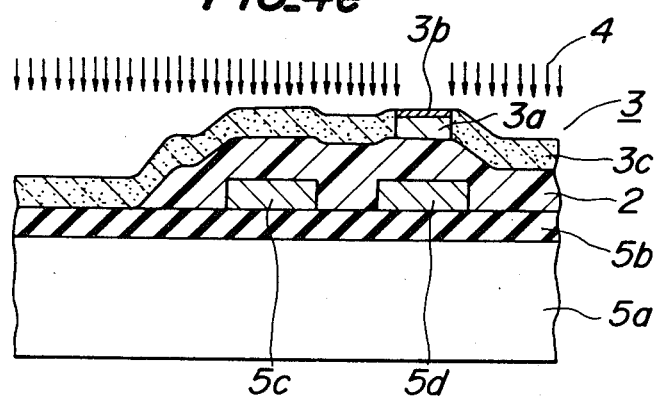
Figure 4F:
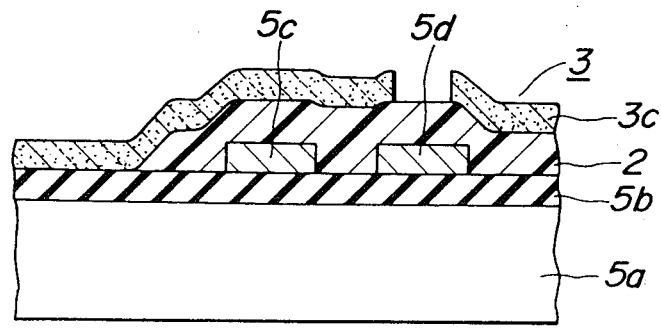
Figure 4G:
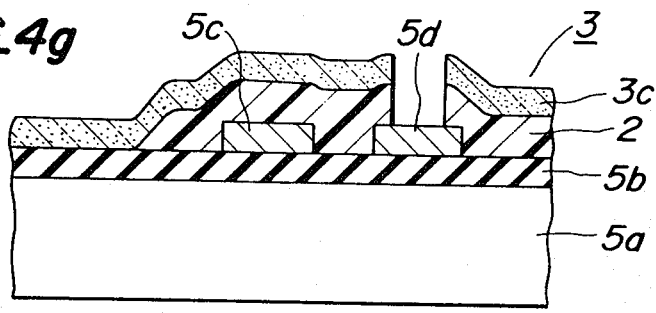
Figure 4H:
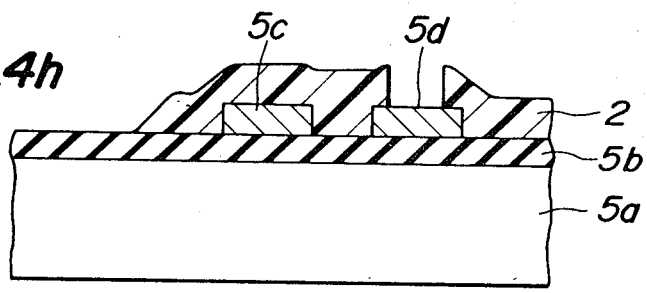
Figure 4I:
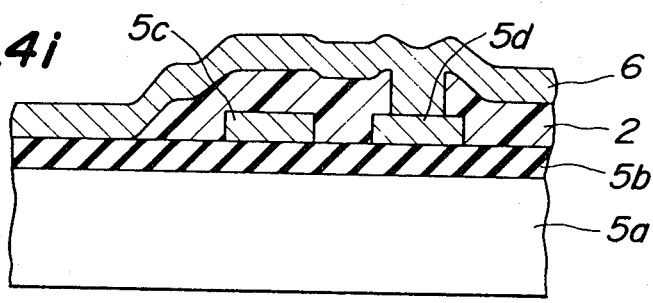
Figure 4J:
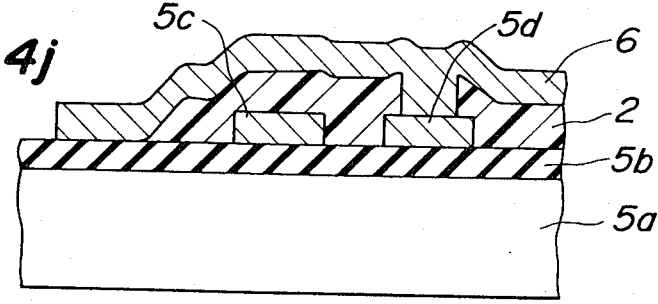

In the case where the main surface of such type of the substrate material 5 as described above is patterned with an upper layer which is, for example, electrically insulated from the conductor layer 5c by means of an interlayer insulation layer, while contacts with the conductor layer 5d, and is extended from a position on the interlayer insulation layer to that on the aforesaid insulation layer 5b, the organic polymer resist material layer 2 is first applied on the whole surface of the substrate material as shown in FIG. 4b. As the organic polymer resist material layer 2, any resist material disclosed in the above-mentioned embodiments may be employed, and among others a resist containing cyclized polybutadiene rubber as the principal constitutent is particularly preferable since its electrical properties as an interlayer insulation layer, and more specifically its insulation resistance and dielectric loss are excellent. Then, as shown in FIG. 4c, the organic polymer resist material layer 2 is patterned in accordance with an usual manner so as to establish the pattern as an interlayer insulation layer. Then a similar heat treatment to that in the embodiment mentioned previously follows, so that the patterned organic polymer resist material layer 2 is cured. Thereafter, as shown in FIG. 4d, the inorganic resist material layer 3 is formed on the organic polymer resist material layer 2 and the insulating layer 5b so as to cover the whole surface of the organic polymer resist material layer 2 and exposed portions of the insulation layer 5b on the main surface of the substrate material 5, and then, as shown in FIG. 4e, exposure is made by means of the light or accelerated particle beam 4 like electron beam with a pattern by which a window can be provided on the resist material layer positioned on the conductor layer 5d. Then as shown in FIG. 4f, the inorganic resist material layer 3 is developed and further the organic polymer resist material layer 2 is etched as shown in FIG. 4g, and the inorganic resist material layer 3 is then removed as shown in FIG. 4h. Next, the upper conductor layer 6 is formed on the patterned organic polymer resist material layer 2 and the insulation layer 5b so as to cover the whole surface of the patterned organic polymer resist material layer 2 and the exposed portions of the insulation layer 5b on the main surface of the substrate material 5 as shown in FIG. 4i, and finally the substrate material thus treated is formed in accordance with a publicly known manner to establish a desired pattern, so that a pattern possessing two conductor layers involving the aforesaid organic polymer resist material layer 2 as the interlayer insulation layer is formed as shown in FIG. 4j.

Although the above third embodiment has been described in connection with two-layer pattern, a multi-level pattern including three or more layers can, of course, easily be formed by repeating the process steps as mentioned above.

Figure 5A:
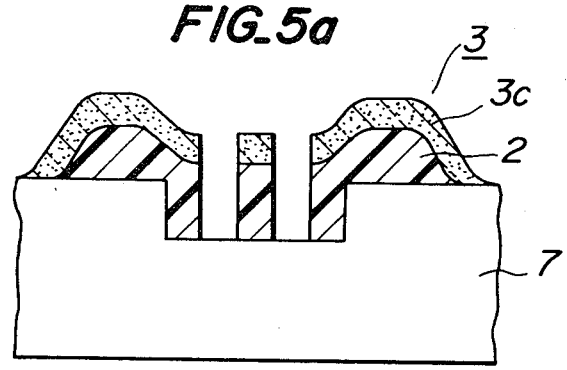
FIGS. 5a–5c are sectional views for explaining each stage in a still further embodiment of the method according to the invention.
Figure 5B:
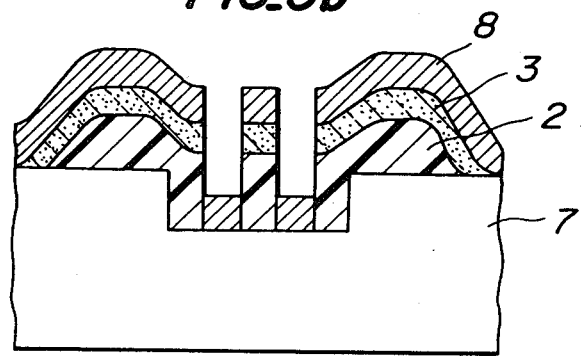
Figure 5C:
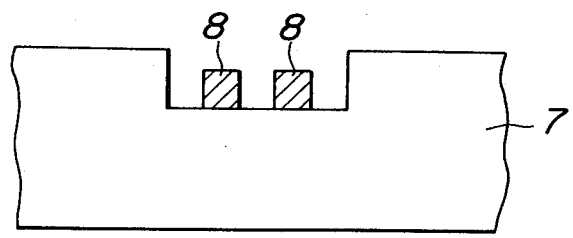

The method of pattern formation according to the present invention is also very effective for the formation of a thin film pattern in accordance with a so-called lift-off method. For instance, in the case where a fine thin film pattern is formed on a recess in the main surface of a nonplanar substrate material 7 as shown in FIGS. 5a–5c, such pattern formation that the whole surface of the recess is covered with the organic polymer resist material layer 2 and a fine pattern formation by means of the inorganic resist material layer 3 are similarly carried out as in the embodiment described above, and then the aforesaid organic polymer resist material layer 2 is subjected to an etching treatment by utilizing the silver doped region 3c in the inorganic resist material layer 3 for forming the aforesaid fine pattern as the mask as shown in FIG. 5a. Then a desired thin film layer 8 is formed so as to cover the inorganic resist material layer 3 and the whole main surface of the substrate material 7 as shown in FIG. 5b, and finally when the organic polymer resist material layer 2 and the inorganic resist material layer 3 are removed, the thin film layer 8 on the aforesaid inorganic resist material layer 3 is simultaneously removed therewith, whereby a desired thin film pattern is formed as shown in FIG. 5c.

Figure 6A:
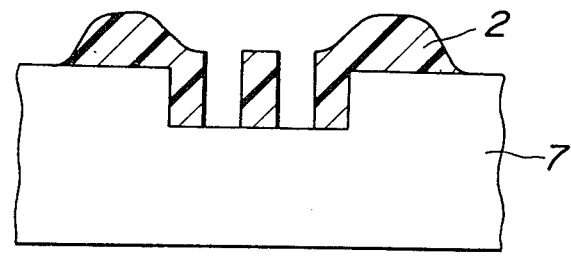
FIGS. 6a–6c are sectional views for explaining each stage in yet another embodiment of the method according to the invention.
Figure 6B:
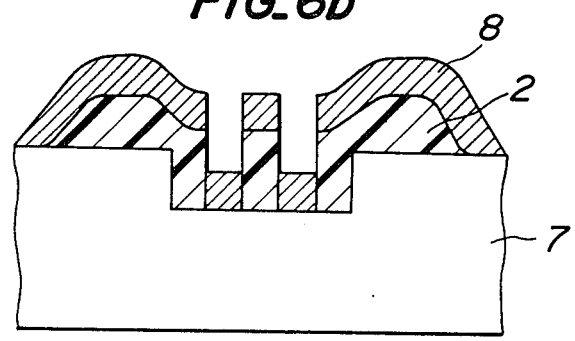
Figure 6C:
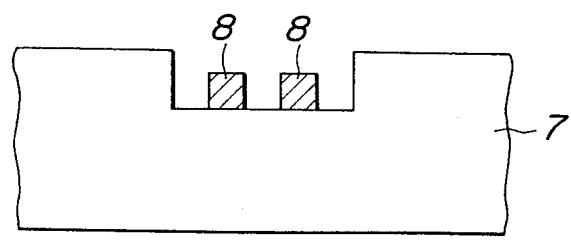

It is to be noted that even if the process steps in the above fourth embodiment are somewhat modified, it is possible to obtain a similar thin film pattern. For instance, as shown in FIG. 5a, a fine pattern with the inorganic resist material layer 3 is transferred to the organic polymer resist material layer 2, then only the inorganic resist material layer 3 is removed as shown in FIG. 6a, a thin film layer 8 is then formed on the organic polymer resist material layer 2 and the main surface of the substrate material 7 which is not covered with the above organic polymer resist material layer 2 as shown in FIG. 6b, and then the organic polymer resist material layer 2 is removed together with the thin film layer 8 thereon, whereby a desired thin film pattern is formed as shown in FIG. 6c. Such manner as stated above is effective for the formation of a relief including a large and small patterns.

As described above, since the method of pattern formation of this invention comprises the steps of forming a first desired pattern with an organic polymer resist material layer, heat-treating the patterned organic polymer resist material layer, then forming an inorganic resist material layer on said patterned organic polymer resist material layer to cover the whole surface thereof, further forming a second desired pattern with the aforesaid inorganic resist material layer, and thereafter transferring the resulting second desired pattern to the aforesaid organic polymer resist material layer, the method according to the invention has the following various excellent advantages.

First, the first desired pattern formed with the organic polymer resist material layer aims at covering and flattening of the whole nonplanar assembled portions of a substrate material, or formation of a relatively large pattern. Accordingly, a high accuracy in pattern is not required, so that it is possible that a film thickness of the organic polymer resist material layer in the invention is very thickened as compared with a case of the pattern formation with only a conventional organic polymer resist material layer. For this reason, etching resistance increases when such organic polymer resist material layer is utilized as a mask for effecting etching treatment of a substrate material. As a consequence, various advantages such that an applicable extent of substrate material as a material to be worked expands, that applicable etchants and etching gas become diversified, and that fine and deep etching become possible can be achieved.

Besides the increase in a film thickness of organic polymer resist material layer as mentioned above as well as the heat treatment after pattern formation of the aforesaid organic polymer resist material layer are very effective for flattening nonplanar portions of a substrate material, and this fact closely relates to improvement of accuracy in the formed pattern in the succeeding step for forming the pattern with an inorganic resist material layer. As a result, it becomes very easy to establish a fine pattern formation with a high accuracy on the surface of a substrate having remarkable nonplanar portions on which a precise pattern could have hardly been formed heretofore, so that the high resolution characteristic of the inorganic resist material layer can effectively be utilized. Furthermore, as mentioned above, increase of the film thickness of a resist mask is easy, besides the method of this invention is very effective for the formation of a mask with high accuracy for, for example, implantation of high energy ion, or for ion beam etching of a strong etch resistive material such as $LiNbO_3$ or the like.

In addition, when manners of the method according to the present invention are functionally divided in such that a relatively large pattern is formed with an organic polymer resist material layer, whilst a fine pattern is formed with an inorganic resist material layer, the exposure source, manner for exposure or the like in case of exposing each pattern can be changed. Thus, when the manner of exposure is selected in accordance with a required accuracy in each pattern formation in such that, for example, light or electron beam is utilized for the large and fine patterns, respectively, the required accuracy can be maintained, besides the exposure time can remarkably be reduced as compared with the case where all the patterns are exposed by means of electron beam, so that throughput can be increased.

Moreover, according to the present invention, when a pattern is formed on an organic polymer resist material layer in response to an alignment mark for the alignment of a mask, only a marked portion can be exposed. Therefore, such disadvantageous problem that the reflected light from a mask cannot be detected in a method of pattern formation in which a bilevel resist is employed can be dissolved, so that automation for the alignment of mask in a light exposure system can be attained.

Besides various combinations of the process steps are possible in the pesent invention, for instance, deep and shallow etching treatments upon a substrate to be worked can efficiently be carried out, and such manner is effective in the case where a film thickness of a layer to be worked is different in different potions in the surface of a wafer and a pattern is formed on such layer to be worked, so that it results in simplification of process steps.

In accordance with the present invention, since the organic polymer resist material layer formed on the substrate material is sufficiently cured during a heat-treating stage after the formation of a pattern, various properties such as hardness, electrical properties, heat resistance and the like are improved, so that the method of the invention becomes very advantageous for formation of an interlayer insulation layer and application of lift-off method. In this respect, the description will be made hereinbelow in more detail.

Interlayer insulation films made of polymer materials including polyamide series resin as a typical example are known, but these films usually have no photosensitivity, i.e., pattern forming function. As the polymer resist materials satisfying characteristic properties of interlayer insulation film, the aforesaid cyclized polybutadiene series resists are known, and when such resists are utilized as the organic polymer resist material layers in the method of the present invention, the following advantages can be expected. That is, there are many cases where fineness and high accuracy are required for an interlayer film throughhole working, but since the working of oganic polymer resist material layer as the interlayer insulation film is carried out in accordance with a reactive ion etching manner by utilizing an inorganic resist mask in the present invention, the required fineness can sufficiently be satisfied. However, in this case, a patterned section of the organic polymer resist material layer comes to be rectangular, and it results in such phenomenon that a conductor hardly enters such narrow rectangular gap between the patterns at the time of forming the conductor layer, so that such phenomenon becomes a cause for breaking the stepped surface of the upper conductor. According to the present invention, since a pattern is formed with an organic polymer resist material layer, a section of the pattern possesses inclined surfaces as shown in the layer 2 of, for example, FIG. 1b. A fine pattern having a rectangular section is formed with an inorganic resist on such patterned organic polymer resist material layer in accordance with a reactive ion etching manner, and then an upper conductor layer is applied on the patterned organic polymer resist material layer having such fine pattern, whereby two-layer conductors involving the organic polymer resist material layer as the interlayer insulation film can be formed. Besides this manner in the present invention is also effective for flattening one layer of the resist surface in a two-layer resist technique. In addition, since a pattern is formed with an organic polymer resist material layer in the present invention, flexibility increases in respect of construction and design for the pattern of interlayer film.

In case of applying the present invention to a method of the formation for an ion implantation mask, a mask having two kinds of ion stopping abilities can be formed, so that a simultaneous formation of two kinds of implantation regions can be made by one ion implantation.

According to the present invention, as described above, function of pattern formation is given to an organic polymer resist material layer, so that many advantages which cannot be attained by a mere two-layer resist technique can be realized, besides problems involved in two-layer resist are also dissolved. Particularly, when the method of the present invention is practiced by modifying the pattern formation processes thereof, the invention is widely applicable for various patterns, layer constructions and layer materials.

What is claimed is:

1. A method of pattern formation, which comprises the steps of:
   forming an organic polymer resist material layer on the surface of a layer to be worked of a substrate;
   exposing said organic polymer resist material layer with a first exposure pattern which relates to an alignment mark on said substrate;
   developing the exposed organic polymer resist material layer to form a first desired pattern which does not cover said alignment mark;
   applying a heat treatment to the patterned organic polymer resist material layer;
   forming an inorganic resist material layer being a laminate consisting of a selenium-based glass material layer and a silver layer or layer containing silver on the organic polymer resist material layer thus heat-treated so as to cover the whole surface thereof and the whole exposed surface of said layer to be worked of the substrate material;
   exposing said inorganic resist material layer with a second exposure pattern which relates to said alignment mark;
   developing the exposed inorganic resist material layer to form a second desired pattern which does not cover said alignment mark;
   etching to remove the organic polymer resist material layer in a region which is not covered with the patterned inorganic resist material layer;
   applying an etching treatment to said layer to be worked in a region which is not covered with said organic polymer resist material layer; and
   removing said inorganic and organic polymer resist material layers.

2. A method of pattern formation as defined in claim 1, wherein said organic polymer resist material layer is made from a resist material comprising cyclized polybutadiene rubber as the principal constituent.

3. A method of pattern formation as defined in claim 1, wherein said selenium-based glass material layer is made from a glass material comprising selenium and germanium as the principal constituents.

4. A method of pattern formation, which comprises the steps of:
   forming an organic polymer resist material layer on the surface of a layer to be worked of a substrate;
   exposing said organic polymer resist material layer with a first exposure pattern which relates to an alignment mark on said substrate;
   developing the exposed organic polymer resist material layer to form a first desired pattern which does not cover said alignment mark;
   applying a heat treatment to the patterned organic polymer resist material layer;
   forming an inorganic resist material layer being a laminate consisting of a selenium-based glass material layer and a silver layer or layer containing silver on the organic polymer resist material layer thus heat-treated so as to cover the whole surface thereof and the whole exposed surface of said layer to be worked of the substrate material;
   exposing said inorganic resist material layer with a second exposure pattern which relates to said alignment mark;
   developing the exposed inorganic resist material layer to form a second desired pattern which does not cover said alignment mark;
   etching to remove the organic polymer resist material layer in a region which is not covered with the patterned inorganic resist material layer;
   removing said inorganic resist material layer;
   applying an etching treatment to said layer to be worked in a region which is not covered with said organic polymer resist material layer; and
   removing said organic polymer resist material layer.

5. A method of pattern formation as defined in claim 4, wherein said organic polymer resist material layer is made from a resist material comprising cyclized polybutadiene rubber as the principal constituent.

6. A method of pattern formation as defined in claim 4, wherein said selenium-based glass material layer is made from a glass material comprising selenium and germanium as the principal constituents.

7. A method of pattern formation, which comprises the steps of:
   forming an organic polymer resist material layer on the surface of a layer to be worked of a substrate;
   exposing said organic polymer resist material layer with a first exposure pattern which relates to an alignment mark on said substrate;
   developing the exposed organic polymer resist material layer to form a first desired pattern which does not cover said alignment mark;
   applying a heat treatment to the patterned organic polymer resist material layer;
   etching to remove said layer to be worked in a region which is not covered with said patterned organic polymer resist material layer;
   forming an inorganic resist material layer being a laminate consisting of a selenium-based glass material layer and a silver layer or layer containing silver on the organic polymer resist material layer thus heat-treated and the exposed layer to be worked by means of said etching treatment so as to cover the whole surface of said organic polymer resist material layer and the surface of said exposed layer to be worked;

exposing said inorganic resist material layer with a second exposure pattern which relates to said alignment mark;

developing the exposed inorganic resist material layer to form a second desired pattern which does not cover said alignment mark;

etching to remove the organic polymer resist material layer in a region which is not covered with the patterned inorganic resist material layer;

applying an etching treatment in said layer to be worked in a region which is not covered with said organic polymer resist material layer; and removing said inorganic and organic polymer resist material layers.

8. A method of pattern formation as defined in claim 7, wherein said organic polymer resist material layer is made from a resist material comprising cyclized polybutadiene rubber as the principal constituent.

9. A method of pattern formation as defined in claim 7, wherein said selenium-based glass material layer is made from a glass material comprising selenium and germanium as the principal constituents.

10. A method of pattern formation, which comprises the steps of:

forming an organic polymer resist material layer on the surface of a layer to be worked of a substrate provided with a patterned conductor layer;

exposing said organic polymer resist material layer with a first exposure pattern which relates to an alignment mark on said substrate;

developing the exposed organic polymer resist material layer to form a first desired pattern which does not cover said alignment mark;

applying a heat treatment to said patterned organic polymer resist material layer;

forming an inorganic resist material layer being a laminate consisting of a selenium-based glass material layer and a silver layer or layer containing silver on the organic polymer resist material layer thus heat-treated so as to cover the whole surface thereof and the whole exposed surface of said layer to be worked of the substrate material;

exposing said inorganic resist material layer with a second exposure pattern which relates to said alignment mark;

developing the exposed inorganic resist material layer to form a second desired pattern which does not cover said alignment mark;

etching to remove the organic polymer resist material layer in a region which is not covered with the patterned inorganic resist material layer;

removing said inorganic resist material layer; and forming a third desired pattern consisting of a conductor layer on said organic polymer resist material layer and said surface of layer to be worked of the substrate material in a region which is not covered with said organic polymer resist material layer.

11. A method of pattern formation as defined in claim 10, wherein said organic polymer resist material layer is made from a resist material comprising cyclized polybutadiene rubber as the principal constituent.

12. A method of pattern formation as defined in claim 10, wherein said selenium-based glass material layer is made from a glass material comprising selenium and germanium as the principal constituents.

13. A method of pattern formation, which comprises the steps of:

forming an organic polymer resist material layer on the surface of a layer to be worked of a substrate;

exposing said organic polymer resist material layer with a first exposure pattern which relates to an alignment mark on said substrate;

developing the exposed organic polymer resist material layer to form a first desired pattern which does not cover said alignment mark;

applying a heat treatment to the patterned organic polymer resist material layer, forming an inorganic resist material layer being a laminate consisting of a selenium-based glass material layer and a silver layer or layer containing silver on the organic polymer resist material layer thus heat-treated so as to cover the whole surface thereof, exposing said inorganic resist material layer with a second exposure pattern which relates to said alignment mark;

developing the exposed inorganic resist material layer to form a second desired pattern which does not cover said alignment mark;

etching to remove the organic polymer resist material layer in a region which is not covered with the patterned inorganic resist material layer, forming a thin film layer on said inorganic resist material layer and said surface of layer to be worked of the substrate material in a region which is not covered with said organic polymer resist material layer, and removing said inorganic and organic polymer resist material layer together with said thin film layer formed on said inorganic resist material layer.

14. A method of pattern formation as defined in claim 13, wherein said organic polymer resist material layer is made from a resist material comprising cyclized polybutadiene rubber as the principal constituent.

15. A method of pattern formation as defined in claim 13, wherein said selenium-based glass material layer is made from a glass material comprising selenium and germanium as the principal constituents.

16. A method of pattern formation, which comprises the steps of:

applying a heat treatment to the patterned organic pllymer resist material layer, forming an inorganic resist material layer being a laminate consisting of a selenium-based glass material layer and a silver layer or layer containing silver on the organic polymer resist material layer thus heat-treated so as to cover the whole surface thereof, etching to remove the organic polymer resist material layer in a region which is not covered with the patterned inorganic resist material layer, removing said inorganic resist material layer, forming a thin film layer on said organic polymer resist material layer and said surface of layer to be worked of the substrate material in a region which is not covered with said organic polymer resist material layer, and removing said organic polymer resist material layer together with said thin film layer formed thereon.

17. A method of pattern formation as defined in claim 16, wherein said organic polymer resist material layer is made from a resist material comprising cyclized polybutadiene rubber as the principal constituent.

18. A method of pattern formation as defined in claim 16, wherein said selenium-based glass material layer is made from a glass material comprising selenium and germanium as the principal constituents.

* * * * *